United States Patent [19]

Frantz

[11] Patent Number: 4,842,528

[45] Date of Patent: Jun. 27, 1989

[54] SOLDER POST RETENTION MEANS

[75] Inventor: Robert H. Frantz, Newville, Pa.

[73] Assignee: AMP Incorporated, Harrisburg, Pa.

[21] Appl. No.: 181,841

[22] Filed: Apr. 15, 1988

Related U.S. Application Data

[63] Continuation-in-part of Ser. No. 32,150, Mar. 27, 1987, abandoned.

[51] Int. Cl.$^4$ .................................... H01R 23/70
[52] U.S. Cl. ................................ 439/80; 439/733
[58] Field of Search ........................... 439/55, 59–62, 439/79, 80, 83, 84, 629, 733

[56] References Cited

U.S. PATENT DOCUMENTS

| | | | |
|---|---|---|---|
| 3,288,915 | 11/1966 | Hatfield . | |
| 3,530,422 | 9/1970 | Goodman | 339/17 |
| 4,080,041 | 3/1978 | Hawkins | 339/196 |
| 4,225,209 | 9/1980 | Hughes | 339/126 |
| 4,292,736 | 10/1981 | Hughes | 29/884 |
| 4,410,230 | 10/1983 | San Miguel | 439/79 |
| 4,491,376 | 1/1985 | Gladd | 339/9 |
| 4,550,962 | 11/1985 | Czeschka | 339/17 |
| 4,660,911 | 4/1987 | Reynolds | 339/17 |
| 4,697,864 | 10/1987 | Hayes | 439/444 |

FOREIGN PATENT DOCUMENTS

| | | |
|---|---|---|
| 1914489 | 11/1969 | Fed. Rep. of Germany . |
| 3330151 | 3/1985 | Fed. Rep. of Germany . |
| 58-175926 | 6/1985 | Japan . |

*Primary Examiner*—Neil Abrams
*Attorney, Agent, or Firm*—David L. Smith

[57] ABSTRACT

A right angle connector assembly (20) having contact receiving passages (36) therein has a solder post spacer plate (46) having a plurality of parallel channels (106) laterally aligned with the contact receiving passages (36). As the mating portion of a contact (38) is inserted into a respective contact receiving passage (36), the mounting portion of the contact (42), typically a solder post (44), is inserted into a laterally aligned channel (106) in the spacer plate (46). The mounting portion of the contact (42) has means (126,132,120,122,124) for preventing axial movement toward the spacer plate (46) on both sides (128,134) thereof. The axial movement preventing means (126,132,120,122,124) may take the form of stop shoulders (130,136) that engage the locator plate. Any attempt to move the mounting portion on one or both sides (128,134) of the locator plate (46) of the contact (38) normal to the plane of the locator plate (46) is prevented.

25 Claims, 4 Drawing Sheets

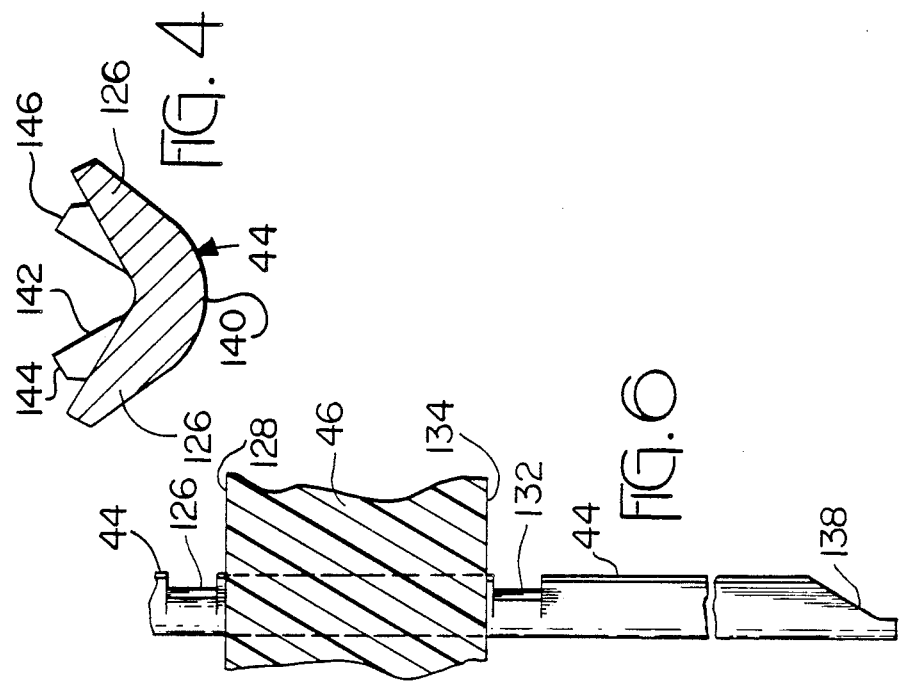
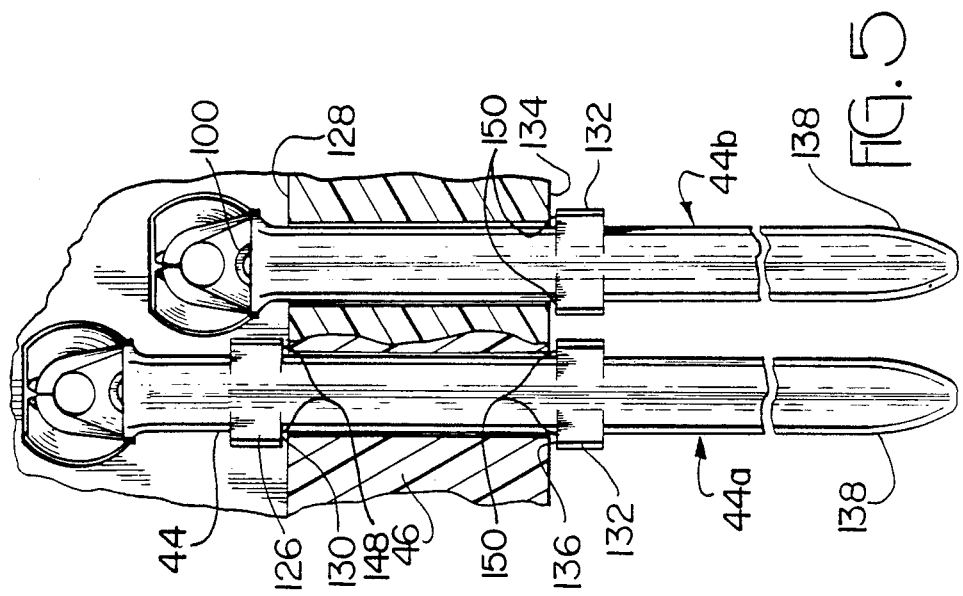

ing portion of the contact substantially at a right angle to the mat-
SOLDER POST RETENTION MEANS

CROSS REFERENCE TO RELATED APPLICATION

This application is a continuation-in-part of Application Ser. No. 032,150 filed Mar. 27, 1987, now abandoned.

BACKGROUND OF THE INVENTION

The present invention relates to electrical connectors and in particular to a solder post retention system for preventing axial movement of solder posts once assembled into right angle mounted connectors.

Right angle connectors are typically mounted on a printed circuit board. A complementary connector mates with the right angle connector in a direction parallel to the printed circuit board. Contacts in the right angle connector have a mating portion that is parallel to the printed circuit board and a mounting portion that is in electrical contact with circuits on the printed circuit board with the mounting portion, typically a solder tail, extending from the mounting face of the connector substantially at a right angle to the mating portion of the contact. Solder tails typically extend through plated through holes in the printed circuit board and are soldered. The array of printed circuit board through holes has the same pattern and spacing as the solder tails extending from the mating face of the connector.

Maintaining the position of solder posts has been recognized as desirable for some time and permits predrilling of the array of holes in the printed circuit board knowing that the solder posts of a connector will correspond in position. Most attention has been given to maintaining the horizontal position of the solder posts. Various approaches have been taken in the prior art such as to make the connector housing in multiple parts, one of which is a locator plate having an array of apertures corresponding to the pattern and spacing of the solder tails extending from the mounting face of the connector. After all of the contacts are inserted into the connector housing, the locator plate is passed over the solder tails from the ends thereof and secured to the connector housing. U.S. Pat. No. 4,080,041 is typical.

Other positions maintaining techniques known in the prior art use a slotted locator plate. With the contacts inserted into contact receiving passages in a connector, the solder tails are bent into the slots of the locator plate such as disclosed in U.S. Pat. No. 4,697,864 or U.S. Pat. No. 4,491,376 which issued to Gladd et al and employs a slotted locator plate in which the slots are narrower in width than the solder tails.

All of the above prior art focuses on maintaining the horizontal position of the solder tails. Insufficient attention has been focused on maintaining the vertical position of solder tails, particularly in right angle connectors.

U.S. Pat. No. 4,225,209 discloses a right angle connector in which conductors are received in spaced-apart channels with alternate channels being relatively deep. The sidewalls of the channels are provided with depressions or recesses which receive barbs integral with and extending laterally from the side edges of the conductors. The intermediate portions of the conductors which extend from apertures to the channels are thus held rigidly by the barbs in the channels and by the conductors received in the apertures.

U.S. Pat. No. 4,550,962 discloses a right angle connector without a locator plate having stop members formed to define stop shoulders on the contact pins to prevent the contact pins from being inserted too far into printed circuit board through holes in which the connector is mounted.

Horizontal positioning of connector solder tails has long been important for assuring that a mass produced connector having a predetermined solder tails pattern would be compatible with a mass produced printed circuit board having a corresponding array of plated through holes. Vertical position, although important, has been inspected upon manual insertion of the connector in a printed circuit board to assure the solder tails extended beyond the printed circuit board a sufficient distance to provide a good solder joint.

With the advent of robotic installation of connectors in printed circuit boards, maintaining the vertical position of solder tails such as during shipping and handling is more critical. For robotic assembly it is important to know precisely where each feature of a connector assembly is relative to a datum reference on the connector assembly. The location of an important feature is the end of the solder tails to assure that during robotic stuffing of a printed circuit board the solder tail ends enter a corresponding array of plated through holes in the printed circuit board. Should the solder tails ride up during insertion of the solder tails in the array of through holes such as due to stubbing, frictional engagement between a solder tail and a through hole, or due to a centering action as the tapered end of a solder tail is urged toward the center of a through hole, a sufficient length of the solder tail may not extend beyond the lower surface of the printed circuit board to provide an acceptable solder joint.

For example, for a 0.062 inch thick printed circuit board, the solder tails should extend 0.062 inch below the board for soldering. Upon assembly of a connector, the tip of the solder tails are therefore positioned 0.125 inch below the housing mounting face, with an allowance for a tolerance, and assure that the solder tails will extend beyond the printed circuit board an appropriate distance for an acceptable solder joint.

The present invention is directed toward providing a solder post retention system for maintaining solder posts in a predetermined position relative to a solder post spacer plate by preventing vertical movement of solder posts once assembled into right angle mounted connectors.

SUMMARY OF THE INVENTION

In accordance with the invention, a right angle connector assembly having contact receiving passages therein has a solder post spacer plating having a plurality of parallel channels laterally aligned with the contact receiving passages. As the mating portion of a contact is inserted into a respective contact receiving passage, the mounting portion of the contact, typically a solder post, is inserted into a laterally aligned channel in the spacer plate. The mounting portion of the contact has means for preventing axial movement toward the spacer plate on both sides thereof. The axial movement preventing means can take the form of stop shoulders on one or both sides of the locator plate that engage the locator plate. Any attempt to move the mounting portion of the contact normal to the plane of the locator plate is prevented. The movement preventing means thus prevent axial movement of the mounting portion of the contacts once the contacts are assembled into the connector assembly.

BRIEF DESCRIPTION OF THE DRAWING

FIG. 4 is a cross-sectional view of a stop taken along line 4—4 in FIG. 1;

FIG. 5 is an enlarged partial view of two contacts in a post spacer plate with stop shoulders engaging the post spacer plate;

FIG. 6 is an enlarged partial view of a contact taken along line 6—6 in FIG. 5;

DESCRIPTION OF THE PREFERRED EMBODIMENT

Figure 1:
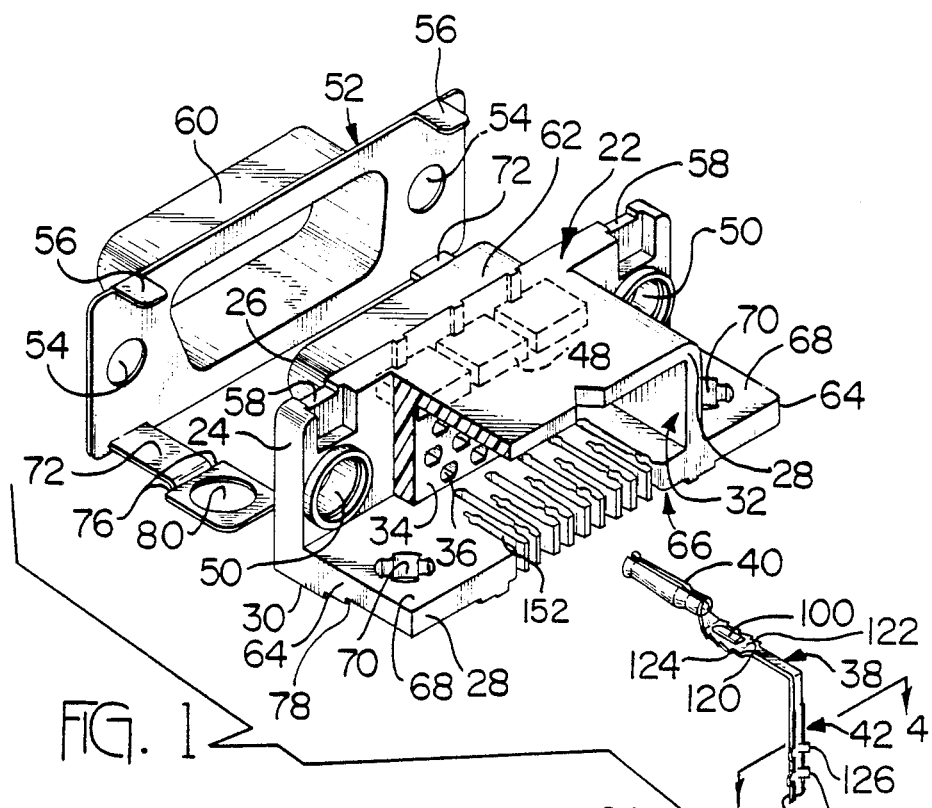
FIG. 1 is a top perspective view of a connector incorporating the solder post retention system for preventing vertical movement of solder posts in accordance with the present invention, with a shell exploded therefrom.

Referring to the Drawing, initially to FIG. 1, there is depicted therein a perspective view of an electrical connector assembly 20 in accordance with the present invention. The connector assembly 20 shown is exemplary and is one of a well known type, namely a subminiature D connector of the type manufactured by the assignee, AMP Incorporated, and sold under the trademark AMPLIMITE.

Connector 20 comprises housing 22 molded of thermoplastic with integral peripheral flange 24, mating face 26, opposed rear face 28 and mounting face 30 at a right angle with respect to mating face 26. Cavity 32 is recessed from rear face 28 and defines recessed face 34. A plurality of contact receiving passages 36 extend from mating face 26 rearward toward rear face 28, open to recessed face 34 and have contacts 38 secured therein. Recessed face 34 is not limited to being planar but could, for example, be stepped. Contacts 38 have a mating portion 40 extending into contact receiving passages 36 that may be either pins or sockets, and extend into cavity 32 with mounting portions 42, typically solder posts 44, that extend through post spacer plate 46. In the preferred embodiment, housing 22 is molded in a single piece with post spacer plate 46 integral therewith. Housing 22 also has apertures 48 for removal of vapor phase material. Mating face 26 is surrounded by flange 24 having mounting apertures 50 at opposite ends thereof for securing a complementary connector (not shown) thereto.

Electrically conductive shell 52 has a similar outer profile to flange 24 with shell mounting apertures 54 aligned with apertures 50. Lugs 56 on the upper portion of shell 52 fold into recesses 58 on flange 24 to secure shell 52 to housing 22. Shroud 60 extends upward from the flat portion of shell 52 and conforms to and encloses the forward raised portion 62 of housing 22.

Mounting face 30 of connector assembly 20 has integral flanges 64 at opposite ends thereof. Each flange 64 has a coplanar mounting face 30 which is received against a printed circuit board (not shown) with channels 66 provided for flux removal, an opposed holding face 68 with aperture 70 extending therebetween.

Shell 52 has integral ground straps 72 extending to respective mounting faces 30. Ground straps 72 fold into channel 74, such that the lower surface of ground strap is coplanar with mounting face 30, and widens near rear face 28 forming shoulders 76 that engage stops 78 to aid in securing ground strap 72 to housing 22 during unmating of a complementary connector. Apertures 80 in the widened region of ground strap 72 align with apertures 70 in flange 64.

Contacts 38 are formed in a strip on the desired centerline spacing such as in accordance with the teaching of application Ser. No. 012,100 filed Feb. 6, 1987, said application being hereby incorporated by reference. During fabrication of a connector assembly 20, contacts 38 on a common carrier strip 82 are unwound from a reel (not shown).

A length of carrier strip 82 called a "comb" having the number of contacts 38 confirming to the number of contact receiving passages 36 in a row of housing 22 is severed from the reel. The solder posts 44 of the contacts 38 on the comb of severed carrier strip 82 are formed to be substantially perpendicular to the mating portion 40 of contacts 38.

Loading block 84 is inserted into cavity 32 seating on recessed face 34. Loading block 84 has a plurality of channels 86 aligned with and corresponding in number to contact receiving passages 36 in the row of passages 36 into which contacts 38 will be inserted. Channels 86 thus provide an extension of contact receiving cavity 36 toward or beyond rear face 28. Channels 86 in loading block 84 open to surface 88 of block 84 through slots 91 The row of contact receiving passages 36 closest to post spacer plate 46 is typically the first to receive contacts 38, then the next closets row of contact receiving passages 36 and so on. A different loading block 84 is used for each row of passages 36 with channels 86 therein aligned with passages 36 in the row of passages into which the contacts 38 are being inserted.

Contacts 38, bent 90 degrees and still integral with carrier strip 82 are partially inserted into respective channels 86 in loading block 84. Contacts 36 are loose pieced by shearing carrier strip 82 between punch 90 and anvil 92 then inserted to a predetermined depth in passages 36 by passing through respective channels 86 in loading block 84 thence into passages 36.

Figure 3:
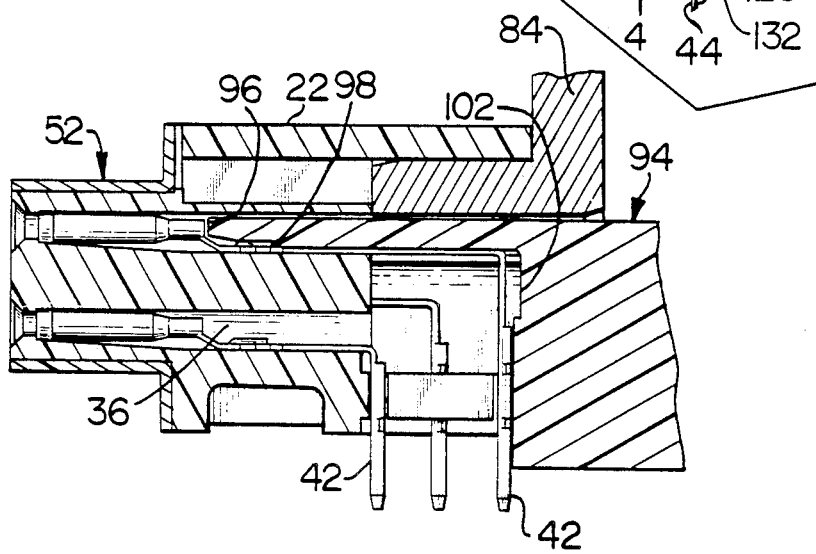
FIG. 3 is a side view, partially in section of a housing having contacts inserted therein.
Figure 2:
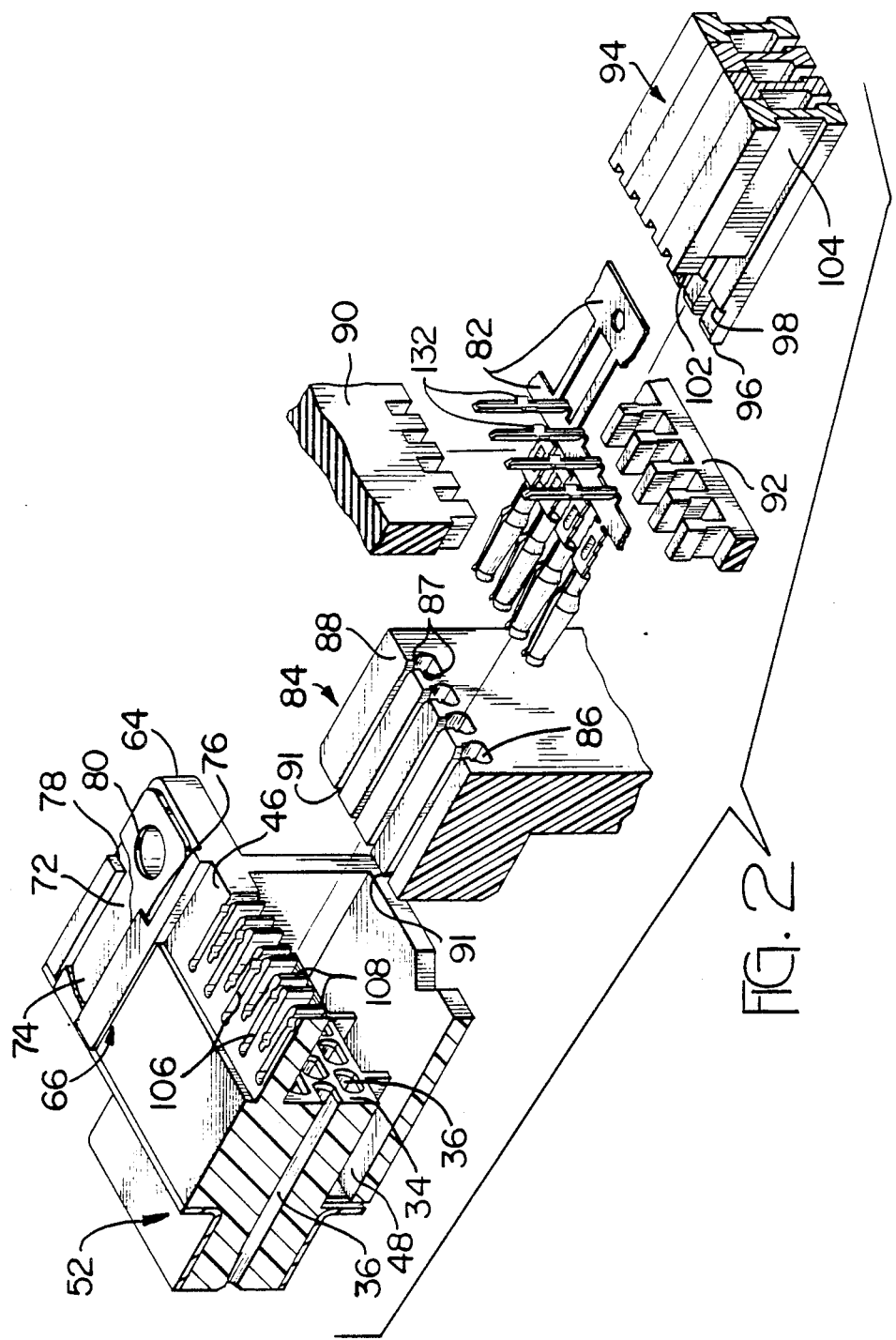
FIG. 2 is a bottom exploded perspective view of a connector incorporating the solder post retention system for preventing vertical movement of solder posts of the present invention.

Insertion tool 94 provides the insertion force to insert contacts 38 into housing 22. As seen in FIG. 3, mating portion push surface 96 engages the rear surface of mating portion 40, insertion feature push surface 98 engages insertion feature 100 and solder post push feature 102 engages substantially the length of solder post 44.

As insertion tool 94 pushes contacts 38 through channels 86, barbs 95 for securing contact 38 in contact receiving passage 38 in an interference fit pass through side channels 87 and solder posts 44 extend through slots 91 and post spacer plate 46. At least a portion 104 of insertion tool 94 passes through slot 91 and channels 106 in post spacer plate 46.

Channels 106 may have detents 93 therealong in which solder tails 44 are secured. Typically the detents 93 form a row or rows along spacer plate 46 with the number of detents 93 in a given channel 106 corresponding to the number of contact receiving passages 36 laterally aligned with that channel.

FIG. 1 includes a perspective view of a typical socket contact 38. Contacts 38 have retention means formed on plate 120 in scalloped edges 122 that terminate in barbs 124. Upon insertion of contacts 38 into contact receiving passages 36 barbs 124, which extend beyond the sidewalls of passages 36, plow through the housing plastic and plastic flows around boards 124 for retention of contacts 38 in passages 36. As shown in FIG. 3, barbs 124 secure plate 120 against the lower surface of passage 34 as positioned by insertion tool 94.

Contacts 38 have means for preventing axial movement of solder posts 44 relative to post spacer plate 46. As shown in FIG. 5, solder post 44a has upper stop means 126 that are offset laterally outwardly from legs of the U-shape cross-section to engage upper surface 128 of post spacer plate 46. Stop means 126 prevents solder posts 44a from moving axially along post spacer plate 46, in a downward direction from the perspective of FIG. 5, as stop shoulder 130 engages upper surface 128.

Solder post 44a has lower stop means 132 that are offset laterally outwardly from legs of the U-shape cross-section to engage lower surface 134 of post spacer plate 46. Stop means 132 prevents solder post 44a from moving axially along post spacer plate 46, in an upward direction from the perspective of FIG. 5, as stop shoulder 136 engages lower surface 134.

Stop means 126 and 142 may be used independently or in combination with each other. When used in combination with each other, stop means 126 and 132 effectively prevent axial movement of solder tails 44 relative to post spacer plate 46. Since solder posts are manufactured to precise dimensions, stop means 126 and 132 secure solder tails 44 such that the precise location of the tips 138 of solder tails 44 are know, relative to a datum reference in the connector assembly. When stop means 126 and 132 are used in combination, stop shoulders 130 and 136 thereof are axially spaced apart on solder post 44 substantially the thickness of post spacer plate 46, with a tolerance allowance for variations in the thickness. The position of stop means 126 and 132 relative to tips 138 and mating portion 40 are application dependent.

A stop means 126 and 132 both above and below post spacer plate is desirable to prevent axial movement of solder posts 44 relative to post spacer plate 46, particularly where contact 38 extends rearward of recessed face 34 in suspension (see FIG. 3) and has a right angle bend in suspension as solder post 44 is much more free to move.

Advantage may be taken of contacts 38 having been secured against the bottom of contact receiving passages 36 as above. Where contacts 38 substantially do not extend into suspension or extend into suspension very little in cavity 32, there is no opportunity for solder tails 44 to move axially toward spacer plate 46 as shown in FIG. 3 and as contact 44b in FIG. 5. Solder tail 44b, which is typical of all solder tails in the lowest row of contact receiving passages 36, is prevented from moving toward upper surface 128 of spacer plate 46 by being secured against the lower surface of a contact receiving passage 36 by barbs 124 on plate 120. Thus, the means for preventing axial movement of solder posts 44 relative to spacer plate 46 can consist of contact 38 being secured against the lower surface of a contact receiving passage 36 by barbs 124 on plate 120 adjacent an upper surface 128 of spacer plate 46 and stop 132 adjacent lower surface 134.

In a preferred embodiment of the invention, as best seen in FIG. 4, solder posts 44 have a U-shaped cross-section having an arcuate outer surface 140, an arcuate concave inner surface 142 and planar surfaces 144,146 extending therebetween at two locations. These surfaces may provide an interference fit with the walls of channels 106.

In a preferred embodiment, stop means 126 and 132 are formed in solder post 44 by shearing the legs of the U-shaped cross-section of solder tail 44 at two spaced locations 148,150. The sheared surface at 148,150 is preferably perpendicular to the axis of solder tail 44 resulting in a pair of stop shoulders 130 or 136 that define a plane that is substantially parallel to surfaces 128,134 of locator plate 46. The sheared leg portions between the spaced locations is laterally separated to extend beyond the remainder of solder tail 44 as seen in FIGS. 4, 5 and 6. One of the shear surfaces at the two spaced locations 148,150 thus forms stop shoulder 130 or 136.

As shown in FIGS. 4, 5 and 6, upper and lower stop means 126,132, in the preferred embodiment, have stop shoulders 130 and 136 respectively that extend beyond walls 152 of channels 106 in spacer plate 46. Stop means 126,132 could take on a conical shape tapering down from a broader cross-section. This embodiment of stop means 126,132 would be inherently forgiving of the thickness of solder plate 46. The conical shape could also taper outwardly from tail 44 providing a shoulder much like shoulders 130,136 adjacent surfaces 128 and 134. Stop means 126 could take on many other forms. One such form is an arcuate bead.

Figure 10:
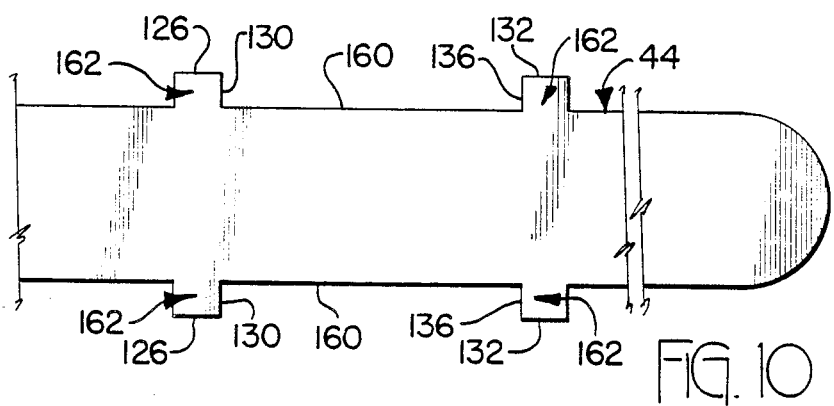
FIG. 10 is a profiled blank from which the solder post of FIG. 7 is formed.

In an alternate embodiment, shown in FIGS. 7 through 10, stop means 126,132 are manifest as tabs 162 that extend beyond the side edges of a profiled solder tail 44. As best seen in FIG. 10, a profiled blank solder tail stamped from strip stock has stop means 126,132 extending from lateral sidewalls 160 rather than shear lines extending into solder tail 44 to provide stop shoulders 130,136. Stamping solder tail 44 as a profiled blank provides precise control over the spacing between stop shoulders 130 and 136.

Like the above-described embodiment of solder tail 44, solder tail 44 in the alternate embodiment has a U-shaped cross-section, convex toward housing 22, having an arcuate outer surface 140, an arcuate concave inner surface 142 and typically surfaces extending therebetween with the convex shape facilitating insertion of solder tail 44 along channel 106 during assembly.

Figure 7:
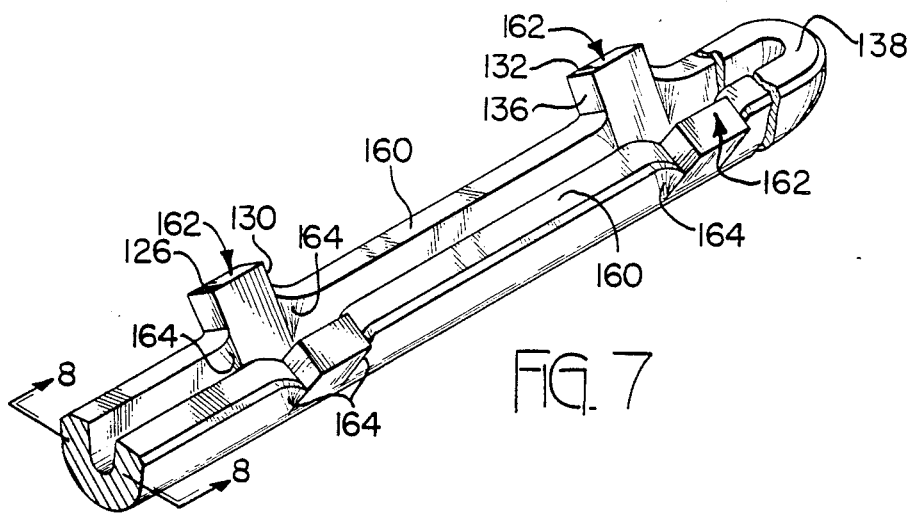
FIG. 7 is a perspective view of an alternate embodiment solder post incorporating a solder post retention system in accordance with the present invention.
Figure 8:
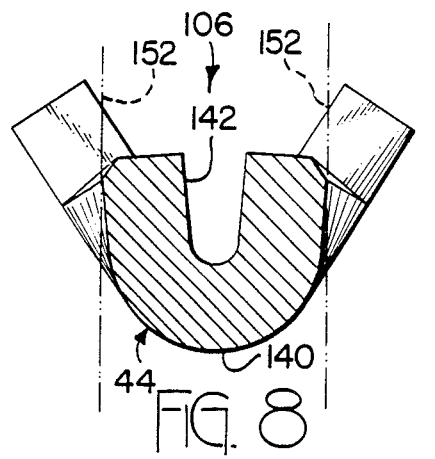
FIG. 8 is a cross-sectional view of a stop, comparable to FIG. 4, taken along the line 8—8 in FIG. 7.
Figure 9:
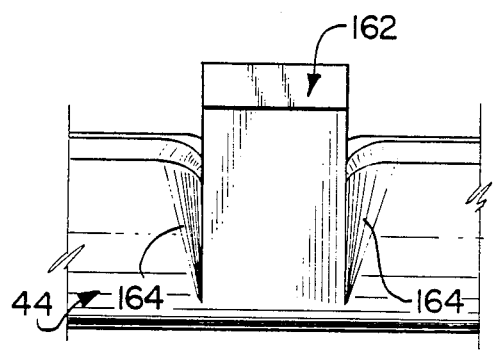
FIG. 9 is a side view of a stop shown in FIG. 7.

With the alternate embodiment solder tail 44 formed to a U-shaped cross-section, an incidental portion of the area of each of stop shoulders 130,136 extends beyond walls 152 of channels 106 and would engage surfaces 128 and 134 of spacer plate 46. The incidental portion of the area of each of stop shoulders 130,136 that extends beyond walls 152 of channels 106 may not be sufficient to prevent axial movement of solder tail 44. To greatly increase the area of stop shoulders 130,136 that extend beyond walls 152 of channels 106 to engage surfaces 128 and 134 of spacer plate 46, tabs 162 are formed or offset laterally outwardly from legs of the U-shape cross-section of solder post 44, as best seen in FIGS. 7 and 8.

When the offset forms more than just tabs 162, a transition region 164 exists adjacent tabs 162 in solder tail 44. In this manner, forming tabs 162 laterally outwardly from the legs of the U-shape cross-section provides a greater portion of stop shoulders 130,136 that extend over surfaces 128 and 134 than would extend thereover if tabs 162 were not formed or offset laterally outwardly from the legs of the U-shape cross-section of solder post 44.

A stop means 126 or 132 may comprise a single tab 162 extending from a lateral sidewall of solder tail 44. Stop means 126 or 132 may comprise a pair of tabs 162 such that the pair of stop shoulders, 130 or 136, defined thereby conform to surfaces 128 and 134. In the preferred embodiment, the pair of stop shoulders 130 are coplanar and the pair of stop shoulders 136 are coplanar.

I claim:

1. An electrical connector assembly, comprising:
   a dielectric housing defining a mating face and a mounting face orthogonal to said mating face, said housing having a plurality of terminal receiving passages extending from the mating face;
   a locator plate extending outwardly along said mounting face from said housing to an end, said locator plate having first and second surfaces, said locator plate having a plurality of parallel channels therein extending inwardly from said end and through the locator plate from said first surface to said second surface and defined by pairs of opposed walls;
   a plurality of electrical terminals mounted in the housing, each terminal having a mating portion extending into a terminal receiving passage and a mounting portion orthogonal thereto extending proximate and outwardly from said mounting face, said mounting portion passing through a respective said channel in the locator plate and having a U-shaped cross-section convex toward said housing to facilitate insertion of said mounting portion along said channel during assembly, said mounting portion having a first stop means adjacent the first surface of said locator plate for preventing axial movement of the mounting portion toward the first surface, said first stop means defining at least one first stop shoulder offset laterally outwardly from a respective side wall of said U-shaped cross-section of the mounting portion of said terminal, said stop shoulder adapted to extend beyond a respective one of said channel defining-walls to engage the first surface of said locator plate, whereby axial movement of said mounting portion of the terminal toward said locator plate is prevented.

2. An electrical connector assembly as recited in claim 1, wherein the locator plate is an integral part of the housing.

3. An electrical connector assembly as recited in claim 1 wherein the mounting portion of the terminal is a solder tail.

4. An electrical connector assembly as recited in claim 1 wherein said first stop means further comprises a second stop shoulder coplanar with said first stop shoulder, said second stop shoulder offset laterally outwardly from a respective sidewall of said U-shaped cross-section of the mounting portion of said terminal, said second stop shoulder adapted to extend beyond a respective one of said channel defining walls to engage said first surface of said locator plate.

5. An electrical connector assembly as recited in claim 1, wherein the plurality of terminal receiving passages are arranged in a plurality of rows.

6. An electrical connector assembly as recited in claim 1, wherein the channels further comprise detents in which the mounting portion of the terminal is secured.

7. An electrical connector assembly as recited in claim 6, wherein the channels have detents therealong corresponding to the number of terminal receiving passages laterally aligned therewith.

8. An electrical connector assembly as recited in claim 1, further comprising a second stop means proximate the second surface of said locator plate for preventing axial movement of the mounting portion toward the second surface, whereby substantially all axial movement of the mounting portion of the terminal, relative to the locator plate, is prevented.

9. An electrical connector assembly as recited in claim 8, wherein the second stop means comprises a stop means defining at least one second stop shoulder offset laterally outwardly from a respective side wall of said U-shaped cross-section of the mounting portion of said terminal, said at least one second stop shoulder adapted to extend beyond said walls of said terminal receiving passage to engage said second surface of said locator plate, whereby axial movement of said mounting portion of the terminal, relative to the locator plate, is prevented.

10. An electrical connector assembly as recited in claim 8, wherein the second stop means comprises a plate having scalloped edges terminating in barbs, said plate being secured in a terminal receiving passage.

11. An electrical connector assembly, comprising:
    a dielectric housing defining a mating face and a mounting face orthogonal to said mating face, said housing having a plurality of terminal receiving passages extending from the mating face;
    a locator plate extending outwardly along said mounting face from said housing to an end, said locator plate having first and second surfaces, said locator plate having a plurality of parallel channels therein extending inwardly from said end and through the locator plate from said first surface to said second surface and defined by pairs of opposed walls;
    a plurality of electrical terminals mounted in the housing, each terminal having a mating portion extending into a terminal receiving passage and a mounting portion orthogonal thereto extending proximate and outwardly from said mounting face, said mounting portion passing through a respective said channel in the locator plate and having a U-shaped cross-section convex toward said housing to facilitate insertion of said mounting portion along said channel during assembly, said mounting portion having sidewalls having extension means extending therefrom, said extension means offset laterally outwardly from a respective side wall of said U-shaped cross-section of the mounting portion of said terminal, said mounting portion having a first stop means on said extension means adjacent the first surface of said locator plate for preventing axial movement of the mounting portion toward the first surface, said first stop means defining at least one first stop shoulder, said first stop shoulder adapted to extend beyond a respective one of said channel defining-walls to engage the first surface of said locator plate, whereby axial movement of said mounting portion of the terminal toward said locator plate is prevented.

12. An electrical connector assembly as recited in claim 11, wherein the locator plate is an integral part of the housing.

13. An electrical connector assembly as recited in claim 11 wherein the mounting portion of the terminal is a solder tail.

14. An electrical connector assembly as recited in claim 11 wherein said first stop means further comprises a second stop shoulder on said extension means, said second stop shoulder coplanar with said first stop shoulder, said second stop shoulder adapted to extend beyond a respective one of said channel defining walls to engage said first surface of said locator plate.

15. An electrical connector assembly as recited in claim 11, wherein the plurality of terminal receiving passages are arranged in a plurality of rows.

16. An electrical connector assembly as recited in claim 11, wherein the channels further comprise detents in which the mounting portion of the terminal is secured.

17. An electrical connector assembly as recited in claim 16, wherein the channels have detents therealong corresponding to the number of terminal receiving passages laterally aligned therewith.

18. An electrical connector assembly as recited in claim 11, further comprising a second stop means proximate the second surface of said locator plate for preventing axial movement of the mounting portion toward the second surface, whereby substantially all axial movement of the mounting portion of the terminal, relative to the locator plate, is prevented.

19. An electrical connector assembly as recited in claim 18, wherein the second stop means comprises a stop means on said extension means defining at least one second stop shoulder, said at least one second stop shoulder adapted to extend beyond said walls of said terminal receiving passage to engage said second surface of said locator plate, whereby axial movement of said mounting portion of the terminal, relative to the locator plate, is prevented.

20. An electrical connector assembly as recited in claim 18, wherein the second stop means comprises a plate having scalloped edges terminating in barbs, said plate being secured in a terminal receiving passage.

21. An electrical connector having a dielectric housing defining a mating face and a mounting face orthogonal to said mating face, said housing having a plurality of terminal receiving passages extending from the mating face, a locator plate extending outwardly along said mounting face from said housing to an end, said locator plate having first and second surfaces, said locator plate having a plurality of parallel channels therein extending inwardly from said end and through the locator plate from said first surface to said second surface and defined by pairs of opposed walls, a plurality of electrical terminals mounted in the housing, each terminal having a mating portion extending into a terminal receiving passage and a mounting portion orthogonal thereto, said mounting portion extending proximate and outwardly from said mounting face, said mounting portion passing through a respective said channel in the locator plate and having a U-shaped cross-section convex toward said housing to facilitate insertion of said mounting portion along said channel during assembly, said mounting portion having sidewalls, a first stop means adjacent the first surface of said locator plate for preventing axial movement of the mounting portion toward the first surface, said first stop means offset laterally outwardly from a respective sidewall of said U-shaped cross-section of the mounting portion of said terminal, said first stop means defining at least one first stop shoulder, said first stop shoulder adapted to extend beyond a respective one of said channel defining-walls to engage the first surface of said locator plate, characterized by extension means extending from said sidewalls, said first stop means on said extension means, whereby axial movement of said mounting portion of the terminal toward said locator plate is prevented.

22. An electrical connector assembly as recited in claim 21 wherein said first stop means is further characterized by a second stop shoulder on said extension means, said second stop shoulder coplanar with said first stop shoulder, said second stop shoulder adapted to extend beyond a respective one of said channel defining walls to engage said first surface of said locator plate.

23. An electrical connector assembly as recited in claim 21, further characterized by a second stop means proximate the second surface of said locator plate for preventing axial movement of the mounting portion toward the second surface, whereby substantially all axial movement of the mounting portion of the terminal, relative to the locator plate, is prevented.

24. An electrical connector assembly as recited in claim 23, wherein the second stop means is characterized by a stop means on said extension means defining at least one second stop shoulder, said at least one second stop shoulder adapted to extend beyond said walls of said terminal receiving passage to engage said second surface of said locator plate, whereby axial movement of said mounting portion of the terminal, relative to the locator plate, is prevented.

25. An electrical connector assembly as recited in claim 23, wherein the second stop means is characterized by a plate having scalloped edges terminating in barbs, said plate being secured in a terminal receiving passage.

* * * * *